(12) United States Patent  (10) Patent No.: US 7,505,262 B2
Mizuno et al.  (45) Date of Patent: Mar. 17, 2009

(54) ELECTRONIC DEVICE

(75) Inventors: Yusuke Mizuno, Kawasaki (JP);
Sonomasa Kobayashi, Kawasaki (JP);
Katsuichi Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 162 days.

(21) Appl. No.: 10/989,509

(22) Filed: Nov. 17, 2004

(65) Prior Publication Data

US 2006/0018087 A1 Jan. 26, 2006

(30) Foreign Application Priority Data

Jul. 22, 2004 (JP) .............................. 2004-214826

(51) Int. Cl.
*H05K 9/00* (2006.01)

(52) U.S. Cl. ...................... 361/685; 361/683; 361/818; 312/223.1; 312/223.2

(58) Field of Classification Search ......... 361/679–686, 361/724–727, 818; 312/223.1, 223.2
See application file for complete search history.

(56) References Cited

U.S. PATENT DOCUMENTS

| 5,552,967 | A | | 9/1996 | Seto et al. |
| 5,691,880 | A | | 11/1997 | Seto et al. |
| 5,696,648 | A | * | 12/1997 | Jeong et al. .............. 360/97.02 |
| 6,347,021 | B2 | * | 2/2002 | Kazmierczak et al. ... 360/97.02 |
| 6,385,042 | B1 | * | 5/2002 | Chen .......................... 361/686 |
| 6,960,719 | B2 | * | 11/2005 | Miksch et al. .............. 174/382 |
| 2003/0081398 | A1 | * | 5/2003 | Tuttle et al. ................. 361/818 |
| 2004/0114321 | A1 | * | 6/2004 | Roh ........................... 361/685 |
| 2006/0155074 | A1 | * | 7/2006 | Kudo et al. .............. 525/329.7 |

FOREIGN PATENT DOCUMENTS

| DE | 92 14 093 | 1/1993 |
| DE | 44 10 729 | 11/1994 |
| JP | 11-184562 | 7/1999 |

OTHER PUBLICATIONS

German Office Action Dated Mar. 10, 2005.

* cited by examiner

*Primary Examiner*—Jayprakash N Gandhi
*Assistant Examiner*—Anthony Q Edwards
(74) *Attorney, Agent, or Firm*—Staas & Halsey LLP

(57) ABSTRACT

An electronic device includes a housing and a receiving part formed in the housing and configured to receive a received device. A part of the receiving part has a shield structure whereby electromagnetic interference is prevented from radiating.

9 Claims, 8 Drawing Sheets

ELECTRONIC DEVICE

BACKGROUND OF THE INVENTION

1. Field of the Invention

The present invention generally relates to electronic devices, and more particularly, to an electronic device having a structure where a received device is provided in a receiving part which is formed in a housing of the electronic device.

2. Description of the Related Art

In an electronic device such as a personal computer (hereinafter, "PC"), a received device, such as a hard disk drive (hereinafter, "HDD") as a storage device of the PC, is provided inside of a housing. See Japan Laid-Open Patent Publication No. 11-184562. Furthermore, in a portable electronic device such as a mobile phone, a battery as an electronic power source is provided inside of the housing. See Japan Utility Model Registration Publication No. 07-036479. Therefore, receiving parts (space forming parts) for receiving the HDD or the battery are provided in these electronic devices.

A cover body is provided at a part facing the receiving part of the housing so that the HDD or the battery can be received in or removed from the received part. The HDD or the battery can be received or detached in a state where the cover body is removed from the housing.

Conventionally, only an HDD or battery having a configuration set in advance is received in the PC or the portable electronic device. Therefore, a configuration of the receiving part which is formed inside of the housing corresponds to the configuration set in advance.

Furthermore, in a case of HDD or others, since a signal having a high frequency is sent and received among electronic circuits, electromagnetic interference (hereinafter, "EMI") may be radiated. Therefore, it is necessary for the housing to have a shield structure so that the radiation of the EMI from the electronic device can be prevented. Conventionally, in order to prevent the EMI generated in the HDD or others from radiating to the outside of the electronic device, a shield film is formed of a conductive material over the entire internal surface of the cover part which covers the receiving part. This shield film is connected to the ground wiring of a circuit formed in the housing and therefore the cover body where the shield film is formed functions as a shield against the EMI.

Meanwhile, a variety of received devices are provided in recent electronic devices such as the PC. More specifically, in the case of HDDs, there is a tendency for an HDD whose disk diameter is 1.8 inches to be used instead of an HDD whose disk diameter is 2.5 inches which is used as a conventionally main product. Furthermore, a compact disk (hereinafter "CD") or a digital video disk (hereinafter "DVD"), instead of the HDD, may be provided in the electronic device.

In this case, there is no standard about the configuration in the case of the HDD whose disk diameter is 1.8 inches, and therefore different configurations are used. Furthermore, configurations of the CD and DVD may be different from the configuration of the HDD. In addition, there are a variety of configurations of the battery.

However, there is a problem in the conventional electronic device in that a received device having a configuration different from a designated configuration cannot be received because the receiving part is set so as to correspond to one configuration set in advance. Because of this, the received device received in the electronic device is limited due to the structure of the receiving part so that a usability of the electronic device is degraded.

Furthermore, as described above, the shield film, as a conventional measure against the EMI, is formed on the entire internal surface of the cover part, which covers the receiving part. However, it is troublesome to form the shield film on the entire internal surface of the cover part which is independent from the housing. In addition, this causes an increase of the product cost.

SUMMARY OF THE INVENTION

Accordingly, it is a general object of the present invention to provide a novel and useful electronic device in which one or more of the problems described above are eliminated.

Another and more specific object of the present invention is to provide an electronic device whereby plural of received devices having different configurations can be installed in one receiving part. It is also another object of the present invention to easily prevent the EMI generated from the received devices from radiating out at a low cost.

The above objects of the present invention are achieved by an electronic device, including:

a housing; and a receiving part formed in the housing and configured to receive a received device;

wherein a part of the receiving part has a shield structure whereby electromagnetic interference is prevented from radiating.

According to the above-mentioned invention, since the part of the receiving part has the shield structure whereby electromagnetic interference is prevented from radiating, it is possible to prevent the electromagnetic interference from radiating from the electronic device.

An installation concave part configured to put the received device therein may be formed in the part of the receiving part.

According to the above-mentioned invention, it is possible for the received device to be securely installed in the receiving part.

The part of the received device which is put in the installation concave part may be situated at a position where a connector is provided.

According to the above-mentioned invention, since the connecter from which the electromagnetic interference easily radiates is put in the installation concave part having the shield structure, it is possible to effectively prevent the electromagnetic interference from radiating from the electronic device.

The shield structure may be formed by forming a conductive film on the installation concave part.

According to the above-mentioned invention, it is possible to form the shield structure with a simple structure where the conductive film is formed on the installation concave part.

The above object of the present invention can be achieved by an electronic device, including:

a housing; and a receiving part formed in the housing and configured to receive a received device;

wherein the receiving part includes a first installation concave part and a second installation concave part, the first installation concave part corresponds to a first received device having a first configuration, a part of the first received device is put in the first installation concave part when the first received device is installed, the second installation concave part corresponds to a second received device having a second configuration different from the first configuration, and a part of the second received device is put in the second installation concave part when the second received device is installed.

According to the above-mentioned invention, the receiving part has the first installation concave part and the second installation concave part, the part of the first received device is put in the first installation concave part, and the part of the second received device having the second configuration different from the first configuration is put in the second installation concave part. Therefore, it is possible to install two received devices having different configurations.

Positions of the first installation concave part and the second installation concave part against the receiving part may be set so that a direction in which the first received device is put is different from a direction in which the second received device is put.

According to the above-mentioned invention, since the positions of the first installation concave part and the second installation concave part against the receiving part are set so that the direction in which the first received device is put is different from the direction in which the second received device is put, it is possible to increase the degree of design freedom of the receiving part and therefore to make the size of the receiving part small.

The first received device and the second received device may be hard disk drive devices and received in the receiving part, in a state where each of the received devices is received by a gasket.

According to the above-mentioned invention, each of the received devices is received in the receiving part in a state where the received device is received by the gasket. Therefore, even if there is a gap between the received device and the receiving part, it is possible to fill up the gap with the gasket and therefore to install the received part in the receiving part securely. In addition, even if an external force is applied to the electronic device, the external force is absorbed by the gasket so that the received device can be protected.

Conductive resin may be provided at the gasket, and the first received device and the second received device may be grounded via the conductive resin.

According to the above-mentioned invention, even in a state where the received device is received by the gasket, it is possible to ground the received device easily and securely.

A part of the first installation concave part may have a shield structure whereby electromagnetic interference is prevented from radiating. A part of the second installation concave part may have a shield structure whereby electromagnetic interference is prevented from radiating.

According to the above-mentioned invention, it is possible to prevent the electromagnetic interference from radiating from the electronic device with the simple structure.

A part of the first received device which is put in the first installation concave part may be situated at a position where a connector is provided. A part of the second received device which is put in the second installation concave part may be situated at a position where a connector is provided.

According to the above-mentioned invention, since the connecter from which the electromagnetic interference easily radiates is shielded, it is possible to effectively prevent the electromagnetic interference from radiating from the electronic device.

Other objects, features, and advantages of the present invention will become more apparent from the following detailed description when read in conjunction with the accompanying drawings.

DETAILED DESCRIPTION OF THE PREFERED EMBODIMENTS

A description is next given, with reference to FIG. 1 through FIG. 10, of embodiments of the present invention.

Figure 1:
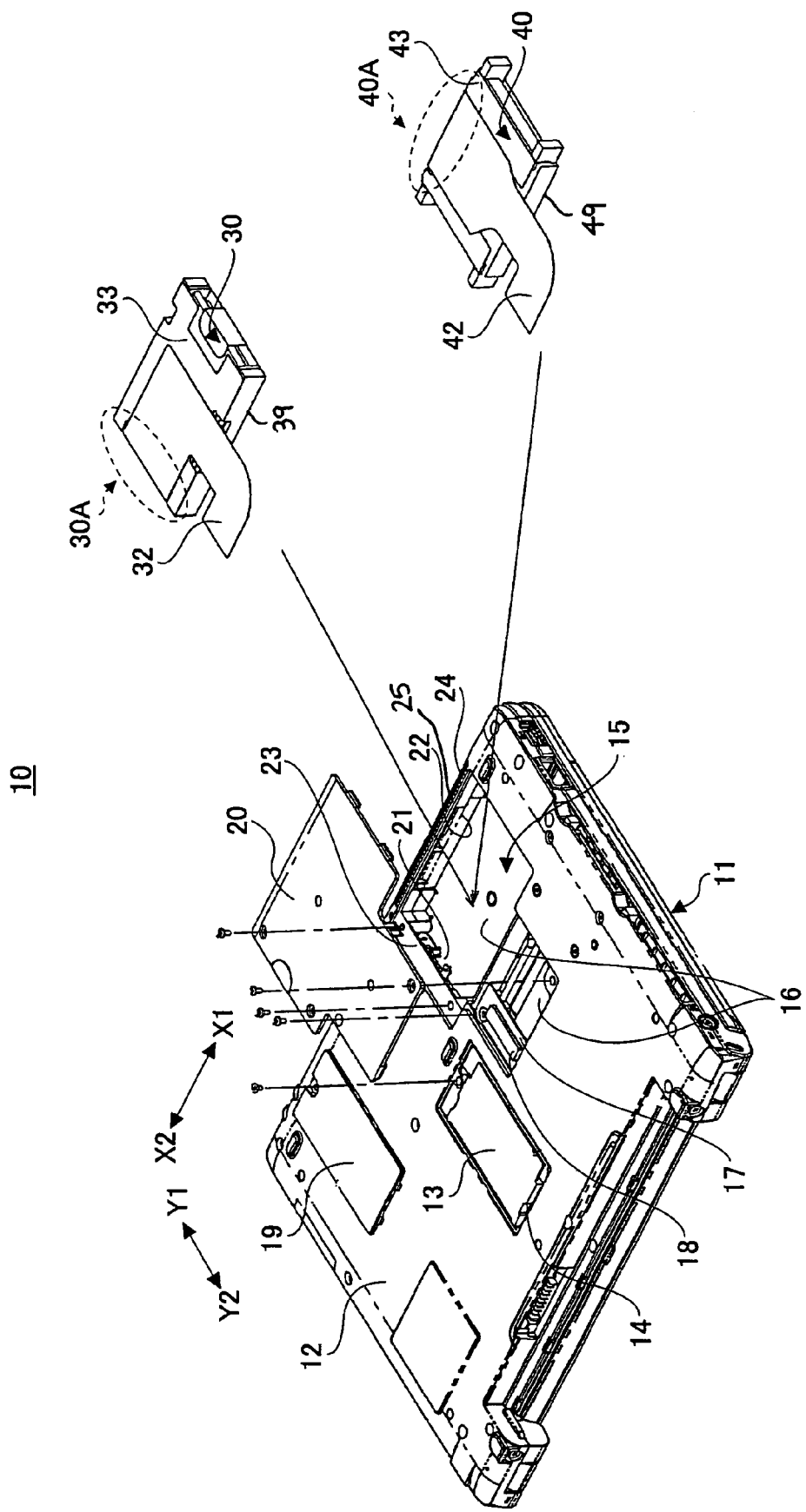
FIG. 1 is a perspective view showing a bottom surface of an electronic device of an embodiment of the present invention in a state where a cover body for an HDD is opened.
Figure 2:
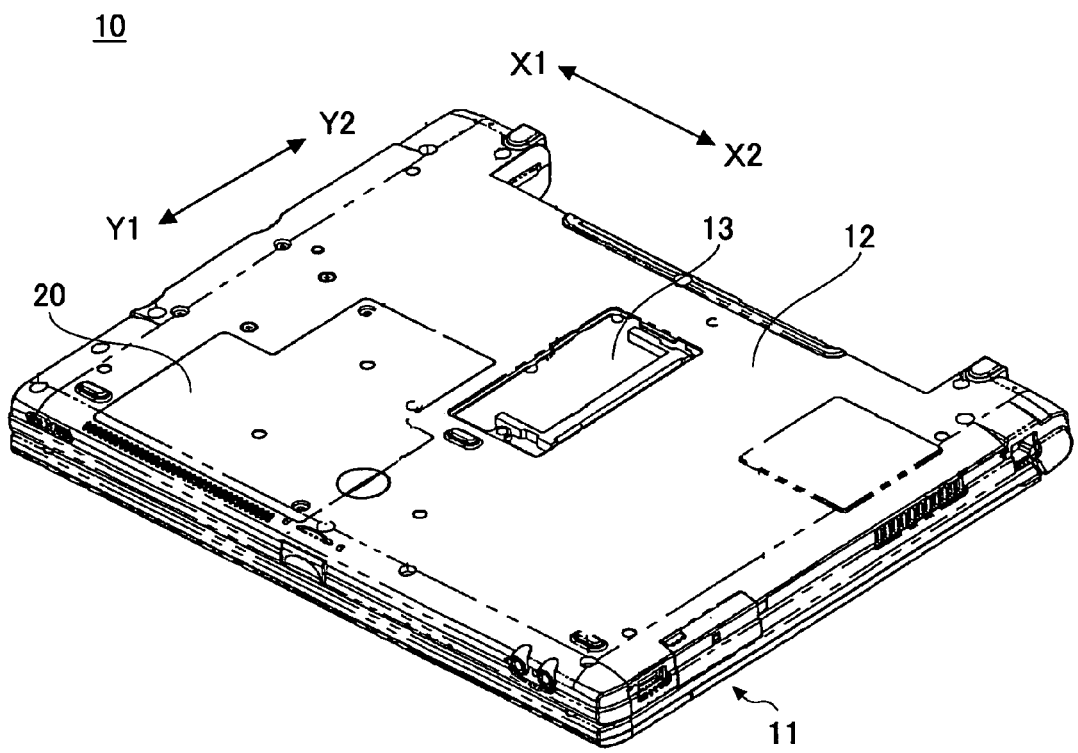
FIG. 2 is a perspective view showing a bottom surface of an electronic device of an embodiment of the present invention in a state where a cover body for an HDD is closed.

FIG. 1 and FIG. 2 are perspective views showing a bottom surface of a portable electronic device 10 of an embodiment of the present invention. In this embodiment, a portable (lap top type) personal computer is used as the portable electronic device 10. For explanation thereof, an illustration of a cover body part of the portable electronic device 10 where a liquid crystal display device is installed, is omitted in FIG. 1 and FIG. 2.

The portable electronic device 10 has a housing 11. A keyboard, a flat point, and others are provided at a side of a front surface (not shown in FIG. 1 and FIG. 2) of the housing 11. A module receiving part 14, an HDD receiving part 15, an opening part 16, and others are formed at a bottom surface 12 of the housing 11.

An expansion module 13 such as an expansion memory is received at the module receiving part 14. The module receiving part 14 is closed by fixing a module cover body 19 with screws. The HDD receiving part 15 functions as a receiving part. A first HDD 30 and/or a second HDD 40 can be detached from the HDD receiving part 15.

The HDD receiving part 15 has a space forming part, having a rectangular configuration, formed in the housing 11. The first HDD 30 and the second HDD 40 are received in the space forming part. The opening part 16 is formed at a part corresponding to the HDD receiving part 15 of the housing 11. The opening part 16 is formed so as to be extended in the Y2 direction in FIG. 1 further than a position where the HDD receiving part 15 is formed. A device side connecter 18 is provided at this extended part of the opening part 15.

An FPC (flexible print board) 32 connected to the first HDD 30 or an FPC 42 connected to the second HDD 40 is selectively connected to the device side connecter 18. The device side connecter 18 is provided at the print board 17 provided in the housing 11.

A first installation concave part 21 is formed at a short side, situated in the X2 direction in FIG. 1, of the HDD receiving part 15. A second installation concave part 22 is formed at a long side, situated in the Y1 direction in FIG. 1, of the HDD receiving part 15.

Figure 7:
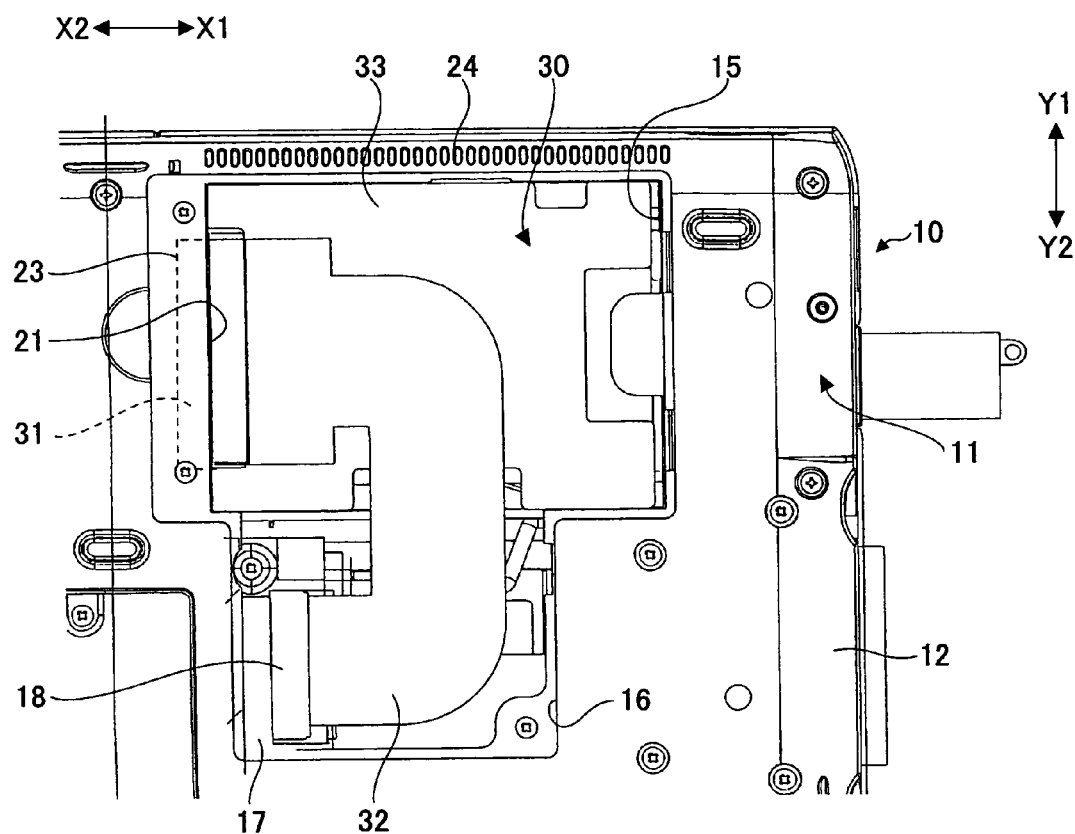
FIG. 7 is an enlarged view showing a state where the first HDD is received in an HDD receiving part of the housing.
Figure 8:
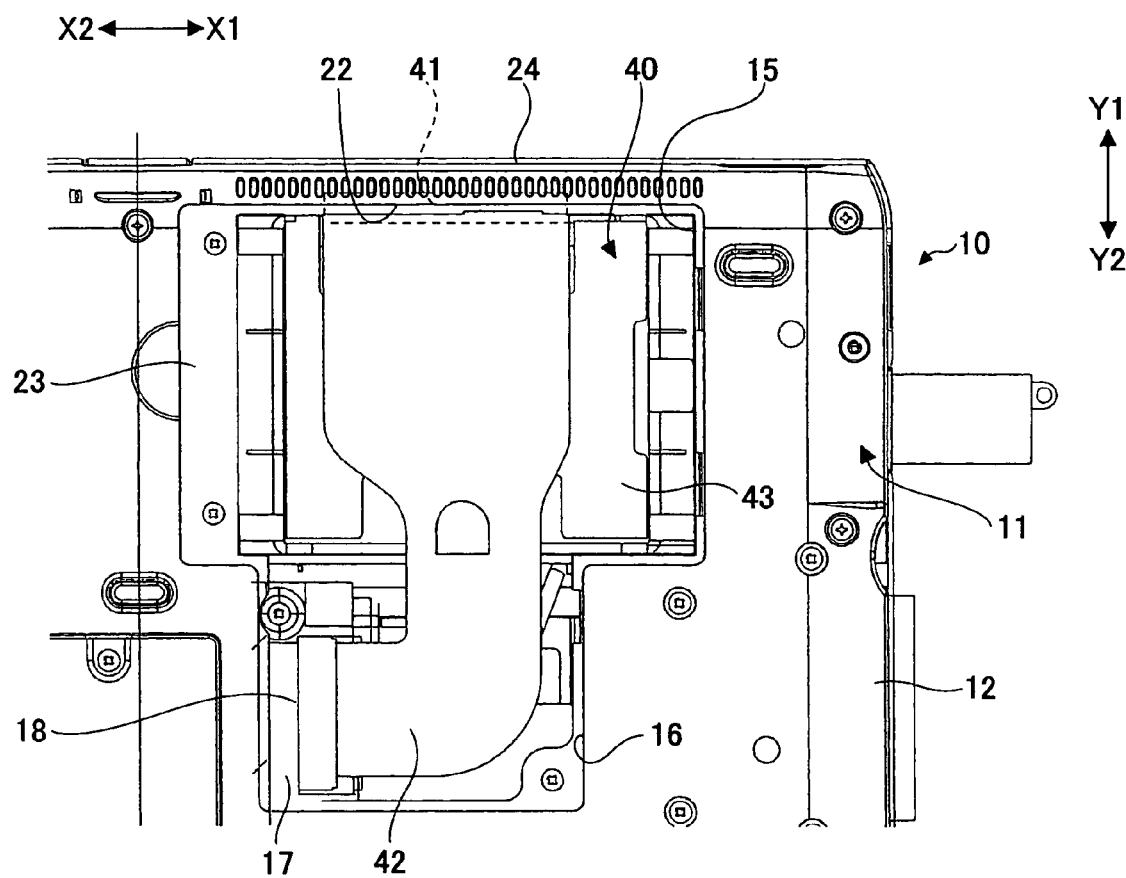
FIG. 8 is an enlarged view showing a state where the second HDD is received in an HDD receiving part of the housing.

As shown in FIG. 1, FIG. 7 and FIG. 8, a side part 30A (enlarged shown in FIG. 3), which is a part of the first HDD 30, is inserted in the first installation concave part 21. A first brim part 23 forming a part of the housing 11 is provided at an upper surface of the first installation concave part 21. A conductive metal 39 is formed on an internal side surface where at least the first HDD 30 is arranged, of the first brim part 23. The conductive metal is connected to a ground line 25 provided in the housing 11.

A side part 40A (enlarged shown in FIG. 4), which is a part of the second HDD 40, is inserted in the second installation concave part 22. A second brim part 24 forming a part of the housing 11 is provided at an upper surface of the second installation concave part 22. A conductive metal 49 is formed on an internal side surface where at least the second HDD 40 is arranged, of the second brim part 24. The conductive metal is connected to a ground line 25 provided in the housing 11. Thus, the conductive metal formations at internal surfaces of the first brim part 23 and the second brim part 24 are grounded.

The first HDD 30 or the second HDD 40 is selectively installed in the above-discussed HDD receiving part 15. In order to receive the first HDD 30 in the HDD receiving part 15, the side part 30A and the first installation concave part 21 are positioned and then the side part 30A is put into the first installation concave part 21 so that the first HDD 30 is received at the HDD receiving part 15. Therefore, the first HDD 30 is put into the first installation concave part 21 in the X2 direction of FIG. 1 by a process for receiving the first HDD 30.

In order to receive the second HDD 40 in the HDD receiving part 15, the side part 40A and the second installation concave part 22 are positioned and then the side part 40A is put into the second installation concave part 22 so that the second HDD 40 is received at the HDD receiving part 15. Therefore, the second HDD 40 is put into the second installation concave part 22 in the Y1 direction of FIG. 1 by a process for receiving the second HDD 40. Thus, the direction in which the HDD 30 is put into the HDD receiving part 15 is different from the direction in which the HDD 40 is put into the HDD receiving part 15.

In this embodiment, the first installation concave part 21 in which a part of the first HDD 30 is put and the second installation concave part 22 in which a part of the second HDD 40 is put, are provided in the HDD receiving part 15. Therefore, two HDDs 30 and 40 having different configurations can be received at the HDD receiving part 15. Furthermore, since the direction in which the HDD 30 is put into the HDD receiving part 15 is different from the direction in which the HDD 40 is put into the HDD receiving part, it is possible to increase the degree of freedom of design of the HDD receiving part 15 and therefore to make the size of the HDD receiving part 15 small.

The first HDD 30 or the second HDD 40 is selectively installed in the above-discussed HDD receiving part 15 so that the FPC 32 and FPC 42 provided at the HDD 30 and HDD 40, respectively, are connected to the device side connector 18. Under this situation, the cover body 20 for HDDs is screw-fixed to the housing 11. Because of this, the opening part 15 is closed by the cover body 20 for HDDs so that, as shown in FIG. 2, the HDD 30 and HDD 40 are received in the housing 11. As described below, in this embodiment, the conductive metal is not formed at the rear surface side of the cover body 20 for HDDs, namely at an internal side of the housing.

Figure 3:
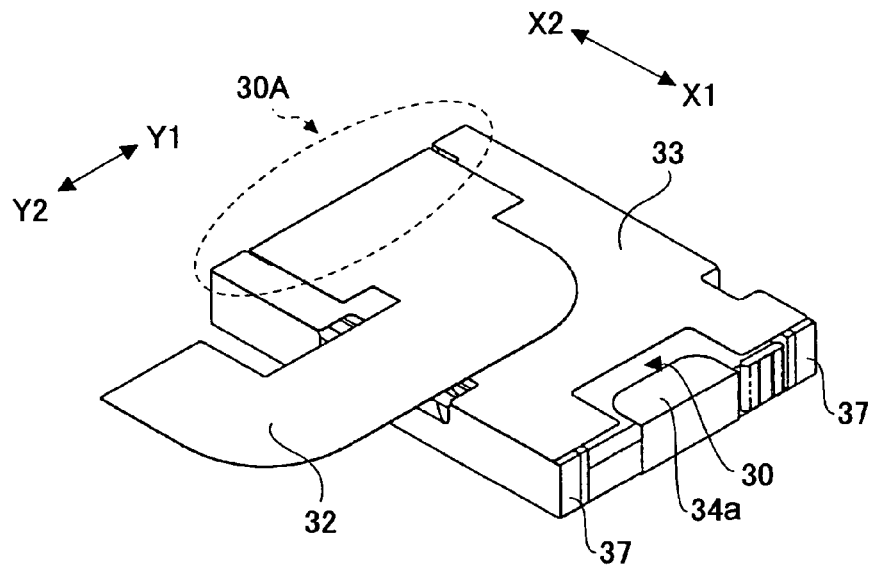
FIG. 3 is a perspective view of a first HDD in a state where the first HDD is received in a gasket.
Figure 4:
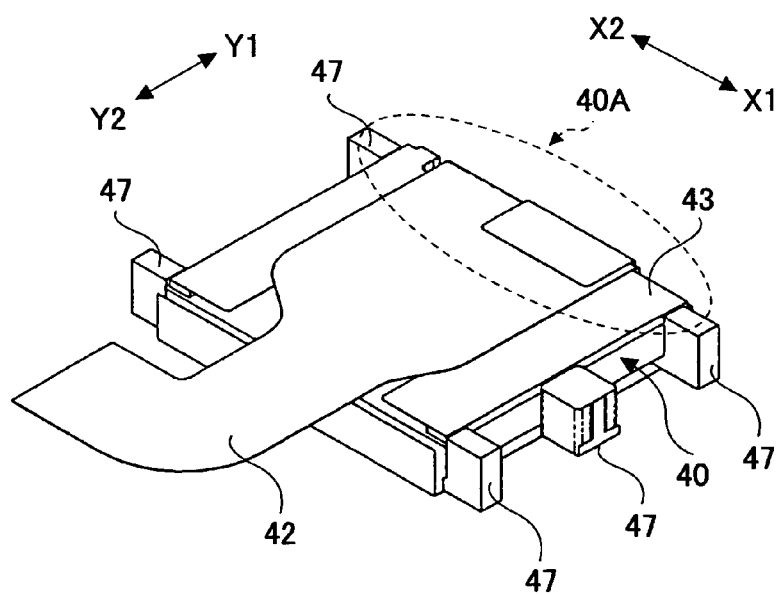
FIG. 4 is a perspective view of a second HDD in a state where the second HDD is received in a gasket.
Figure 5:
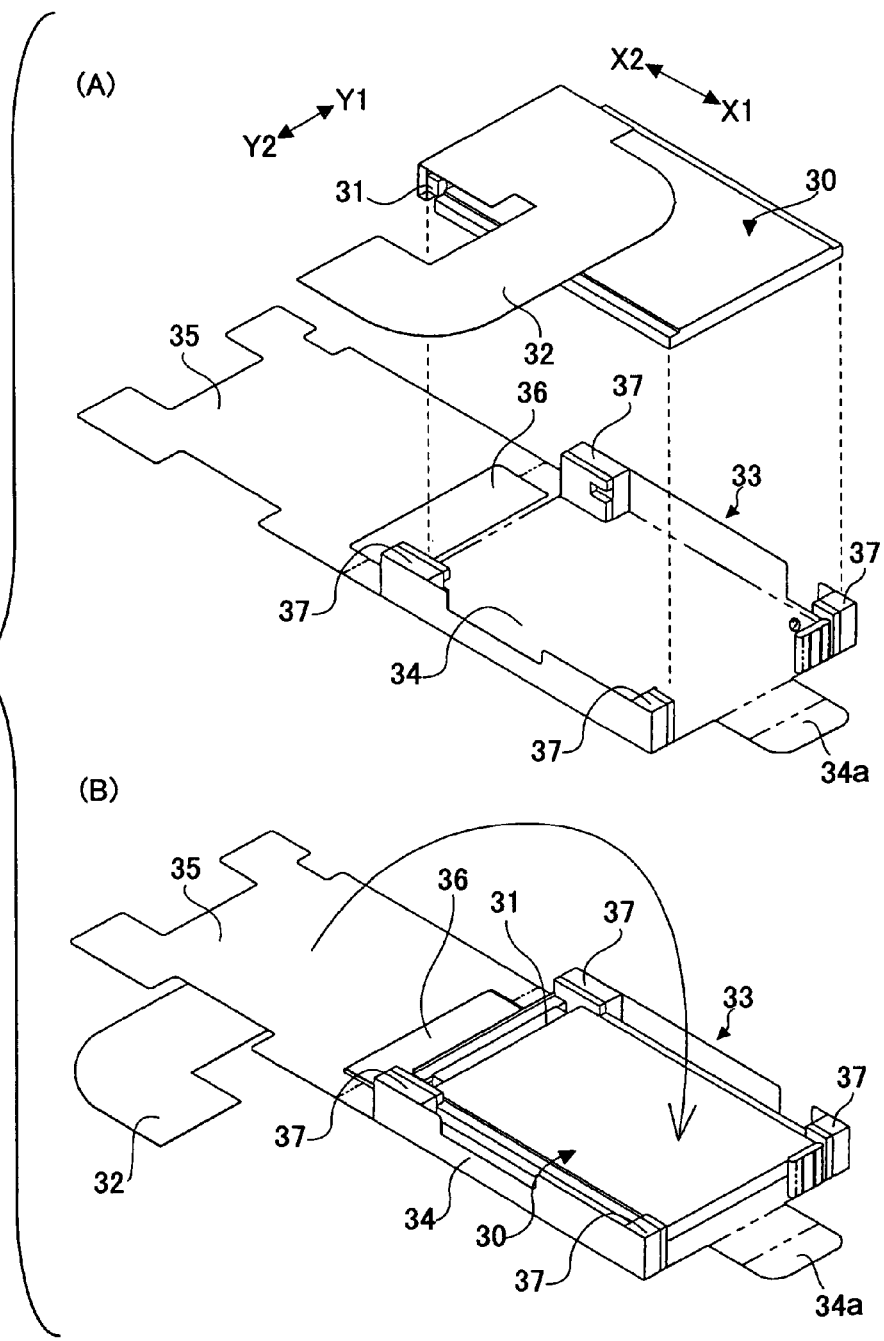
FIG. 5 is a perspective view of the first HDD and shows the configuration of the gasket.
Figure 6:
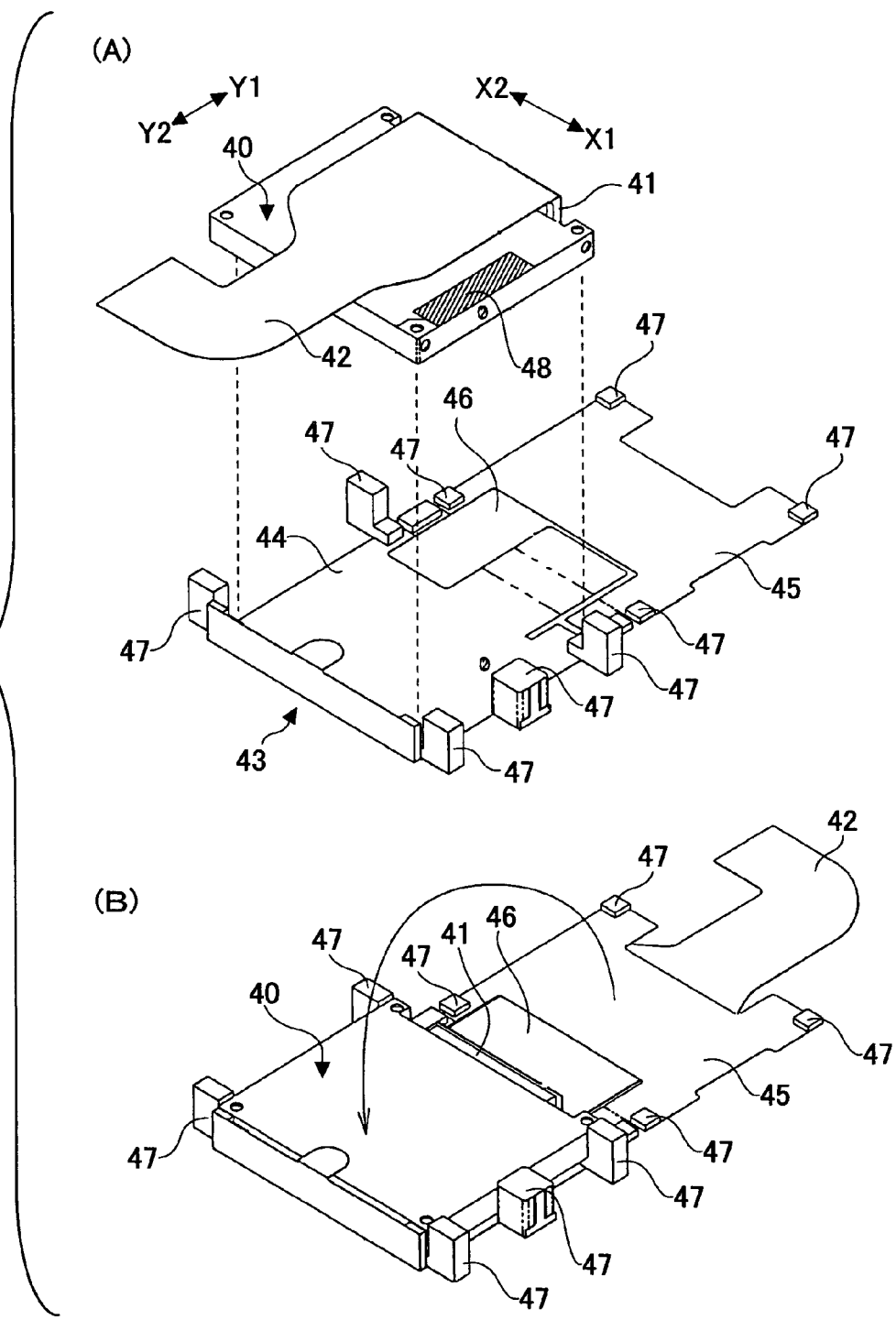
FIG. 6 is a perspective view of the second HDD and shows the configuration of the gasket.

Next, structures of the first HDD 30 and the second HDD 40 are discussed with reference to FIG. 3, FIG. 4, FIG. 5 and FIG. 6. FIG. 3 is a perspective view of the first HDD 30. FIG. 5 is a view for explaining the configuration of a gasket 33 covering the first HDD 30. FIG. 4 is the second HDD 40. FIG. 6 is a view for explaining the configuration of a gasket 43 covering the second HDD 40.

As shown in FIG. 3 and FIG. 4, the HDD 30 and the HDD 40 are received inside of the gasket 33 and gasket 43, respectively. The gasket 33 and gasket 43 are each formed by bending a resin film.

FIG. 5-(A) shows a state where the gasket 33 receiving the first HDD 30 is developed. The gasket 30 is formed by a gasket body 34 and a gasket cover 35.

As described above, the FPC 32 is connected to the first HDD 30. The FPC 32 is also connected to the HDD side connector 31 provided at the first HDD 30. The HDD side connector 31 is arranged at a side in the X2 direction of the first HDD 30. Therefore, the FPC 32 extends from the HDD side connector 31.

The gasket body 34 forming the gasket 33 stands by bending sides situated in Y1 and Y2 directions of the gasket body 34. Conductive resin 37 is provided at four corners of the gasket body 34. The conductive resin 37 is made by mixing a conductive metal powder into the resin and therefore is conductive.

The gasket cover body 35 is formed with the gasket body 34. An insert hole forming part 36 is formed at a connection part which connects the gasket body 34 and the gasket cover body 35. The FPC 32 is inserted into the insert hole forming part 36.

In order to install the first HDD 30 in the gasket 33, first, the first HDD 30 is put on the gasket body 34 so that the housing of the first HDD 30 is electrically connected to the conductive resin 37. Next, the FPC 32 is put into the insert hole forming part 36 so as to be positioned at a lower part of the gasket cover body 35. See FIG. 5-(B).

Next, the gasket cover body 35 is moved for covering in the direction shown by an arrow in FIG. 5-(B) and a tongue-shaped piece part 34a formed at an end part in the arrow X1 direction of the gasket body 34 is fixed to the gasket cover body 35, so that the first HDD 30 received in the gasket 33 shown in FIG. 3 is obtained.

Meanwhile, FIG. 6-(A) shows a state where the gasket 43 receiving the second HDD 40 is developed. The gasket 43 is formed by the gasket body 44 and the gasket cover body 45.

As described above, the FPC 42 is connected to the second HDD 40. The FPC 42 is also connected to the HDD side connector 41 provided at the second HDD 40. The HDD side connector 41 is arranged at a side in the X1 direction of the second HDD 40. Therefore, the FPC 42 extends from the HDD side connector 41.

The gasket body 44 forming the gasket 43 stands by bending only a side situated in the Y1 direction of the gasket body 44. The conductive resin 47 is provided at four corners of the gasket body 44 and a substantially center position of one side. The gasket cover body 45 is formed with the gasket body 44. An insert hole forming part 46 is formed at a connection part which connects the gasket body 44 and the gasket cover body 45. The FPC 42 is inserted into the insert hole forming part 46.

In order to install the first HDD 40 in the gasket 43, first, the second HDD 40 is put on the gasket body 44 so that the housing of the second HDD 40 is electrically connected to the conductive resin 47. Next, the FPC 42 is put into the insert hole forming part 46 so as to be positioned at a lower part of the gasket cover body 45. See FIG. 6-(B).

Next, the gasket cover body 45 is moved for covering in the direction shown by an arrow in FIG. 6-(B) and the gasket cover body 45 is fixed by an adhesive 48 (shown by hatching in FIG. 6) provided on an upper surface of the second HDD 40, so that the second HDD 40 received in the gasket 43 shown in FIG. 4 is obtained.

As described above, the first HDD 30 and the second HDD 40 are received in the HDD receiving part 15 in a state where the first HDD 30 and the second HDD 40 are received in the gaskets 33 and 43, respectively. Therefore, it is possible to prevent the gap from being formed between the HDDs 30 and 40 and the receiving part 15. Because of this, even if the HDDs 30 and 40 have different configurations, it is possible to receive the HDDs 30 and 40 in the HDD receiving part 15. Furthermore, even if an external force is applied to the electronic device 10, the external force is absorbed by the gaskets 33 and 43 so that the HDDs 30 and 40 can be securely protected without damage.

In addition, in a state where the HDDs 30 and 40 are received in the HDD receiving part 15, the conductive resins 37 and 47 formed in the gaskets 33 and 43 are connected to a ground line formed in the housing 11. Furthermore, as described above, the conductive resins 37 and 47 are electrically connected to cases of the HDDs 30 and 40, respectively. Therefore, the HDDs 30 and 40 are connected to the ground line in the housing 11 via the conductive resins 37 and 47 so that a secure shield is accomplished.

Referring to FIG. 7 and FIG. 8, a state where the first HDD 30 and the second HDD 40 are received in the HDD receiving part 15 is discussed. First, a state where the first HDD 30 shown in FIG. 7 is received in the HDD receiving part 15 is discussed. As described above, the end part in the X2 direction of the first HDD 30 is put in the first installation concave part 21 in the arrow X2 direction so that the first HDD 30 is installed. Therefore, in the HDD side connecter 31 of the first HDD 30, the conductive material film is situated at a lower part of the first brim part 23.

Next, a state where the second HDD 40 shown in FIG. 8 is received in the HDD receiving part 15 is discussed. As described above, the end part in the Y1 direction of the second HDD 40 is put in the second installation concave part 22 in the arrow Y1 direction so that the second HDD 40 is installed. Therefore, in the HDD side connecter 41 of the second HDD 40, the conductive material film is situated at a lower part of the second brim part 24.

Thus, in this embodiment, the connecter 31 of the first HDD 30 has a structure where the conductive metal film is covered with the first brim part 23 and the connecter 41 of the second HDD 40 has a structure where the conductive metal film is covered with the second brim part 24. Furthermore, as described above, the conductive metal films formed at the first brim part 23 and the second brim part 24 are grounded. Accordingly, positions where the connecters 31 and 41 are formed are shielded.

Positions at the HDDs 30 and 40 where the EMI is easily generated are positions where the connectors 31 and 41 whose connection terminals are exposed to the outside are formed. In the positions where the connecters 31 and 41 are formed, contacts of the connecters 31 and 41 and wirings of the FPCs 32 and 42 may be exposed from insulators and therefore the EMI may be easily generated.

In this embodiment, the positions where the connecters 31 and 41 of the HDDs 30 and 40 from which the EMI is easily generated are formed are covered with the first brim part 23 and the second brim part 24, respectively, so that the EMI is prevented from being generated out from the housing 11. Furthermore, it is possible to accomplish measures against the EMI without forming the conductive film for shielding on the internal surface of the cover body 20 for HDDs.

Figure 9:
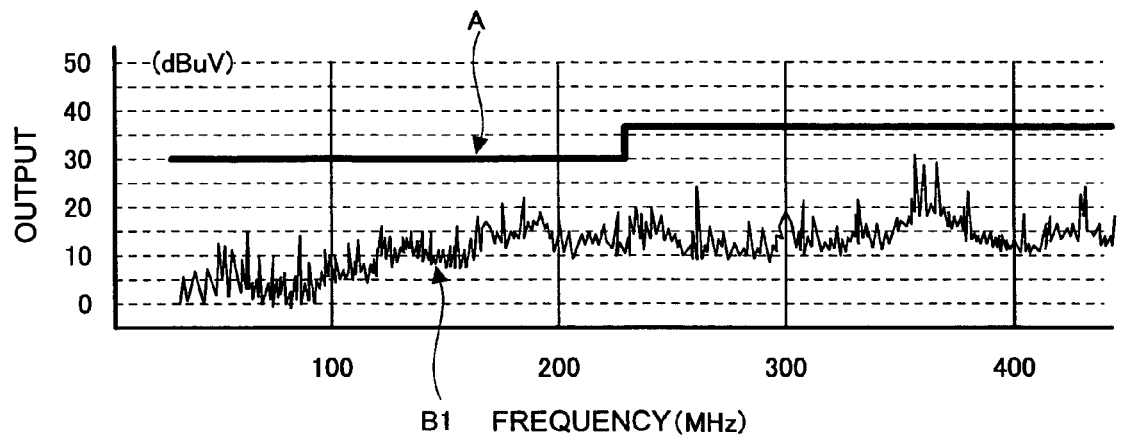
FIG. 9 shows a chart about an EMI noise generated in the electronic device of the embodiment of the present invention.
Figure 10:
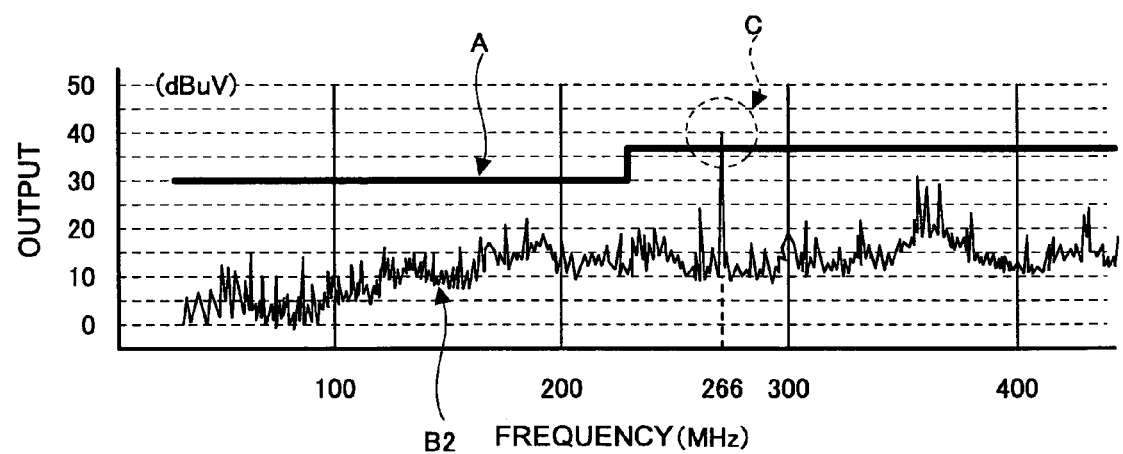
FIG. 10 shows a chart about an EMI noise generated in the conventional electronic device.

FIG. 9 is a graph for actually proving that the EMI is reduced by the structure of the embodiment of the present invention. For the comparison, FIG. 10 shows the amount of the EMI of a conventional electronic device. In the conventional electronic device, the position where the connector for the HDD is situated is not shielded and the conductive film for shielding is formed on the internal surface of the cover body for the HDDs.

In FIG. 9 and FIG. 10, the horizontal axis represents the frequency of a signal applied to the HDD and the vertical axis represents the value of the EMI radiating from the electronic device. The line shown by an arrow A shows a permissible value for the generation of the EMI.

As shown by an arrow C in FIG. 10, in the conventional electronic device, a specific characteristic beyond the permissible value A is found in the case of frequency 266 MHz. On the other hand, in the electronic device 10 of this embodiment, the value of the EMI is below the permissible value A in all frequency areas and therefore it is found that the EMI is effectively prevented. Thus, according to the electronic device 10 of the embodiment of the present invention, it is possible to prevent the EMI from radiating from the electronic device 10.

The present invention is not limited to these embodiments, but variations and modifications may be made without departing from the scope of the present invention. For example, although the HDD is explained as one example of the received device in the above explanation, the present invention is not limited to be applied to the HDD but can be applied to other received devices such as an electronic circuit or a battery.

This patent application is based on Japanese Priority Patent Application No. 2004-214826 filed on Jul. 22, 2004, the entire contents of which are hereby incorporated by reference.

What is claimed is:

1. An electronic device, comprising:
   a housing; and
   a receiving part formed in the housing and configured to receive a received device,
   wherein a concave part, configured to receive a portion of the received device therein, is formed in the receiving part and a brim part is formed at an upper surface of the concave part,
   a ground line is provided in the receiving part,
   a conductive metal is formed on the received device, and
   the conductive metal is connected to the ground line along the brim part so that electromagnetic interference is prevented from radiating.

2. The electronic device as claimed in claim 1, wherein:
   the part of the received device which is put in the concave part is situated at a position where a connector is provided.

3. An electronic device, comprising:
   a housing; and
   a receiving part in the housing, configured to receive a received device,
   wherein the receiving part includes a first concave part and a second concave part,
   the first concave part corresponds to a first received device having a first configuration, including a first conductive metal formed thereon,
   a part of the first received device is put in the first concave part when the first received device is installed, the second concave part corresponds to a second received device having a second configuration, including a second conductive metal formed thereon, the second configuration being different from the first configuration, a part of the second received device is put in the second concave part when the second received device is installed, a ground line is provided in the receiving part and connected to the first conductive metal and the second conductive metal, and respective positions of the first concave part and the second concave part within the receiving part are set so that a direction in which the first received device is put in is different from a direction in which the second received device is put in.

4. The electronic device as claimed in claim 3, wherein:

the first received device and the second received device are hard disk drive devices and are received in the receiving part, in a state where each of the received devices is received by a gasket.

5. The electronic device as claimed in claim 4, wherein:

conductive resin is provided at the gasket, and the first received device and the second received device are grounded via the conductive resin.

6. The electronic device as claimed in claim 3, wherein:

a part of the first concave part has a shield structure whereby electromagnetic interference is prevented from radiating.

7. The electronic device as claimed in claim 3, wherein:

a part of the second concave part has a shield structure whereby electromagnetic interference is prevented from radiating.

8. The electronic device as claimed in claim 6, wherein:

a part of the first received device, which is put in the first concave part, is situated at a position where a connector is provided.

9. The electronic device as claimed in claim 7, wherein:

a part of the second received device which is put in the second concave part is situated at a position where a connector is provided.

* * * * *